(12) United States Patent
Moreau et al.

(10) Patent No.: US 8,946,896 B2
(45) Date of Patent: Feb. 3, 2015

(54) EXTENDED LINER FOR LOCALIZED THICK COPPER INTERCONNECT

(75) Inventors: David Moreau, Fishkill, NY (US); Jerome Ciavatti, Cave Creek, AZ (US)

(73) Assignee: STMicroelectronics, Inc., Carrollton, TX (US)

( * ) Notice: Subject to any disclaimer, the term of this patent is extended or adjusted under 35 U.S.C. 154(b) by 572 days.

(21) Appl. No.: 12/650,805

(22) Filed: Dec. 31, 2009

(65) Prior Publication Data

US 2010/0171219 A1 Jul. 8, 2010

Related U.S. Application Data

(60) Provisional application No. 61/142,062, filed on Dec. 31, 2008.

(51) Int. Cl.
| | |
|---|---|
| *H01L 23/48* | (2006.01) |
| *H01L 23/528* | (2006.01) |
| *H01L 21/768* | (2006.01) |
| *H01L 23/532* | (2006.01) |

(52) U.S. Cl.
CPC ...... *H01L 23/5283* (2013.01); *H01L 21/76834* (2013.01); *H01L 21/76838* (2013.01); *H01L 21/76852* (2013.01); *H01L 21/76885* (2013.01); *H01L 23/53238* (2013.01)
USPC .......................................................... 257/751

(58) Field of Classification Search
USPC ................. 257/751, 753, 758, 775, E23.142, 257/779–781, 784
See application file for complete search history.

(56) References Cited

U.S. PATENT DOCUMENTS

| | | | | |
|---|---|---|---|---|
| 6,703,282 | B1 * | 3/2004 | Yang et al. | 438/306 |
| 7,521,316 | B2 * | 4/2009 | Sohn et al. | 438/257 |
| 8,674,507 | B2 * | 3/2014 | Chou et al. | 257/748 |

OTHER PUBLICATIONS

Andricacos et al., "Damascene copper electroplating for chip interconnections," IBM Journal of Research and Development, vol. 42, No. 5, 1998, 5 pages.

* cited by examiner

*Primary Examiner* — Hoa B Trinh
(74) *Attorney, Agent, or Firm* — Seed IP Law Group PLLC

(57) ABSTRACT

A dielectric layer overlies a semiconductor substrate. The substrate has components and appropriate contacts formed therein. The dielectric layer electrically insulates the substrate and components from overlying conductive interconnect layers. A barrier layer is arranged over the dielectric layer to isolate the interconnect layers from other structures. A copper layer is then deposited over the barrier layer and thick interconnect lines having a first width and a first height are realized. Then, the barrier layer is etched using one of many alternative techniques. The barrier layer has a second width and a second height wherein the second width of the barrier liner is selected to be greater than the first width of the thick copper interconnect.

21 Claims, 12 Drawing Sheets

*Semiconductor Substrate with Electronic Component Elements*

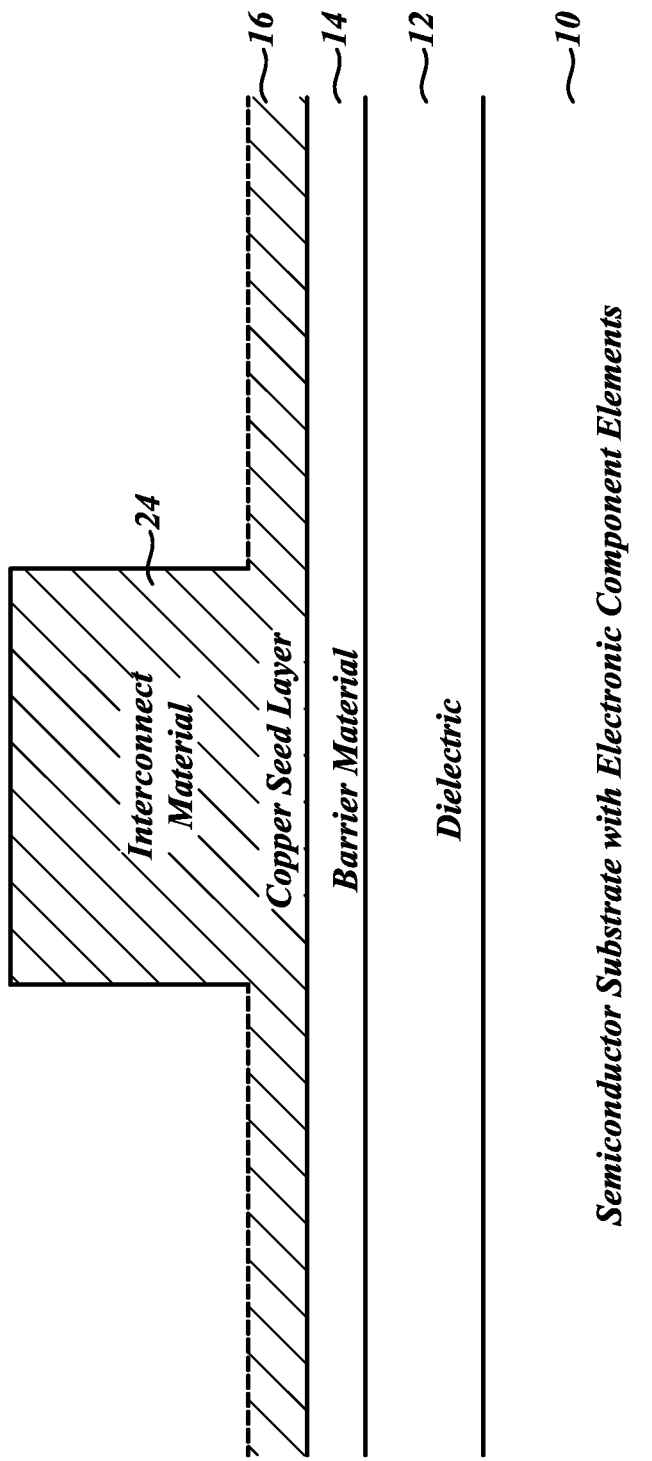
FIG. 1C *(Prior Art)*

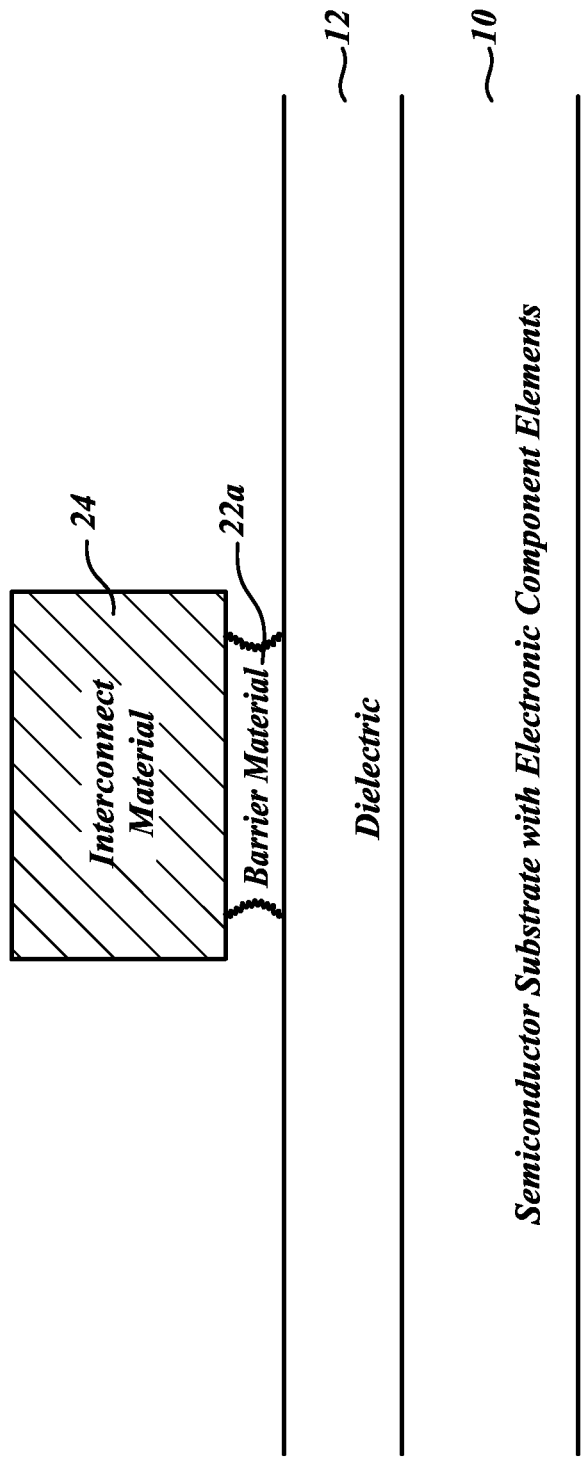
FIG. 2 *(Prior Art)*

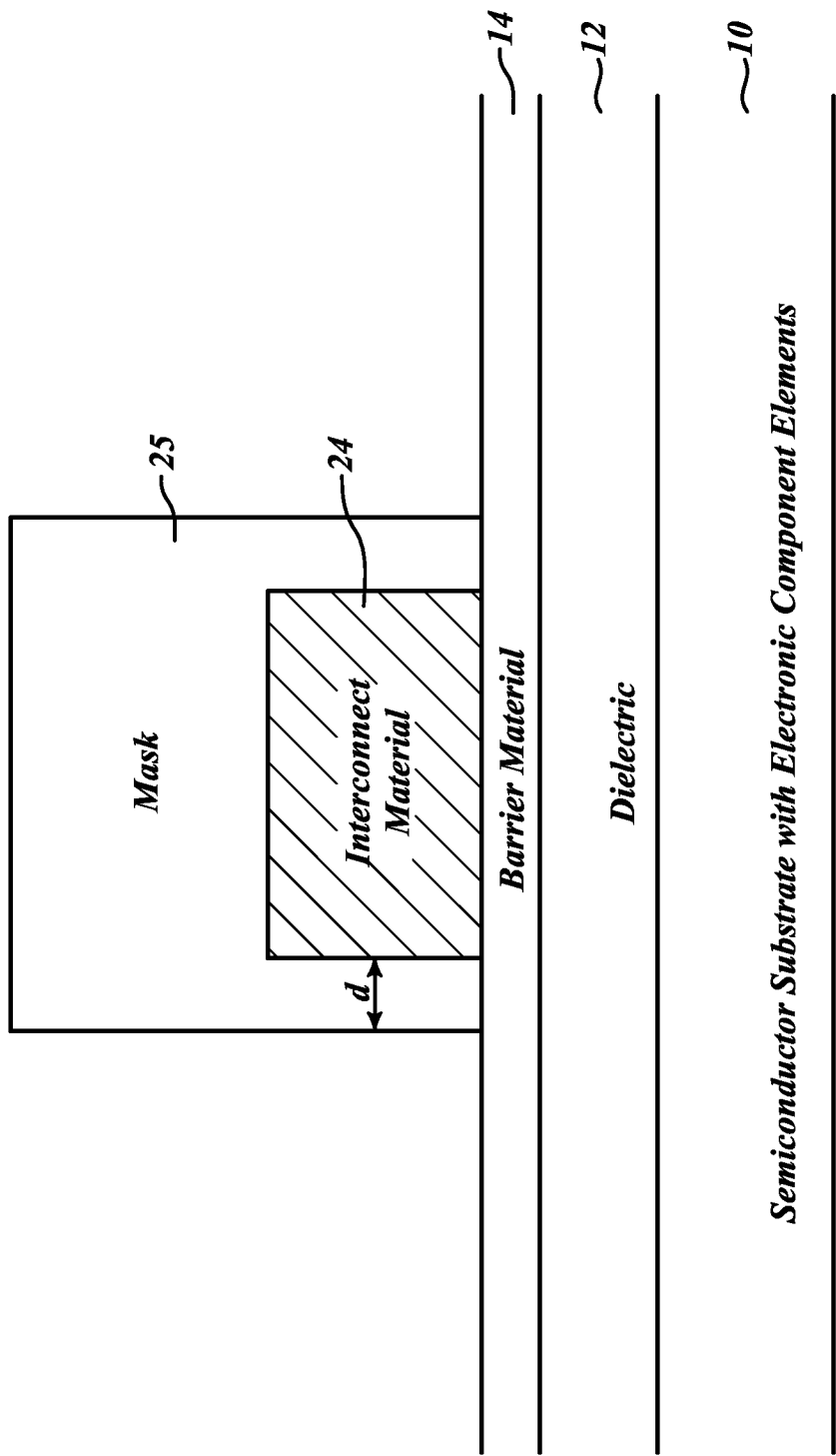

EXTENDED LINER FOR LOCALIZED THICK COPPER INTERCONNECT

CROSS REFERENCE TO RELATED APPLICATIONS

This application claims the benefit of U.S. Provisional Application No. 60/142,062, filed Dec. 31, 2008 and entitled "Extended Liner For Localized Thick Copper Interconnect," hereby incorporated by reference in its entirety.

BACKGROUND OF THE INVENTION

1. Technical Field

This invention relates to an electrically conductive interconnect in a semiconductor structure and, more particularly, to a liner positioned between the dielectric layer and the conductive interconnect for permitting a localized interconnect.

2. Description of the Related Art

With ongoing development of semiconductor device fabrication technology, the critical dimensions of interconnects are designed to provide signal paths that are electrically, mechanically, and cost efficiently robust. The interconnect lines are electrically isolated from other parts of the device. In conventional technology, a 130 nm process, for example, copper damascene, is one process used to form semiconductor device interconnects.

In the copper damascene and other device manufacturing processes, several techniques are used to form and shape structures of different material compositions. Such techniques include, but are not limited to, photolithography, anisotropic chemical or ion etching, chemical-mechanical planarization (CMP), plasma enhanced chemical vapor deposition (PECVD), and electroplating.

Copper damascene, however, has limitations not found in other techniques for forming conductive interconnects. For example, a damascene process is generally limited to very thin interconnects, e.g., 2-5 microns. For both thin and thicker interconnects however, e.g., across the range of 2-50 microns or more in height, other types of interconnect procedures are also available. Often, thick interconnects are about 7-10 microns.

In many applications, e.g., power applications, there is a need to pass high power signals. In such applications, the performance characteristics for interconnects are different from the performance characteristics of conventional memory or microprocessor signaling applications. In these power applications and other like applications, conductive films are formed with different dimensions. For example, if a copper interconnect design calls out a 5 or more microns interconnect height, the copper damascene process is no longer suitable.

As an alternative to copper damascene, another technique is available. This other technique is called a localized thick interconnect, and generally includes traditional photolithography and electroplating processes. The localized thick interconnect process can generate thick copper or other conductive interconnections from 2 to 50 microns or more in thickness. Traditional localized thick interconnect processes can produce unreliable interconnects.

FIGS. 1A-1E illustrate cross-sectional views of a progression of steps in a prior art conventional localized thick copper process for producing a copper line acting as a localized conductive interconnect. Interconnects are common structures in semiconductor based electronic devices. Several methods are available to produce an interconnect, and some examples known in the art will now be described.

FIG. 1A illustrates a semiconductor substrate wafer having various electronic components and foundational interconnect layers formed thereon. The substrate can be silicon monocrystalline silicon, or any other semiconductor suitable for forming electronic components.

In the embodiment of FIG. 1A, a dielectric layer 12 is formed on a monocrystalline silicon substrate 10 containing various electronic components. The dielectric layer 12 could be a combination of layers or a single layer. In some cases, a plasma enhanced chemical vapor deposition (PECVD) process deposits silicon nitride ($Si_3N_4$) or silicon oxynitride (SiON) or combinations thereof. A barrier material 14, also referred to as a barrier liner, is formed on the dielectric layer 12. The barrier material 14 is generally 0.2 to 0.5 microns thick, but could have other dimensions.

Preferably, the barrier material 14 will have sufficient resistance to the diffusive properties of the copper to prevent spoilage of the underlying electronic circuits and surrounding structures. The barrier material 14 should also preferably adhere well to the dielectric layer 12. In addition, the barrier material 14 will preferably be conductive and electrically bondable to the copper that will form the interconnect.

The barrier material 14, in cooperation with the dielectric layer 12, is useful to prevent copper atoms from a copper interconnect from diffusing to the surrounding structure and the silicon substrate 10. Without a proper barrier against copper diffusion, the underlying electronic components formed on the substrate 10 could be contaminated by the copper atoms from the interconnect.

In FIG. 1A, after the liner 14 is formed, a seed layer 16 of interconnect material, copper in this case, is deposited in some processes of the prior art. The seed layer 16 is generally 0.2 to 0.5 microns thick, but could have other dimensions. The seed layer 16, also called a plating base, is used to cover the wafer where electrical contact will be made with underlying circuitry. Accordingly, the seed layer 16 in this embodiment functions as an adhesion layer for the subsequently plated copper or copper base alloy that will form the interconnect.

Alternatively, an integrated physical vapor deposition (PVD) process could also be a method selected to deposit the seed layer 16. In addition, the PVD process may be used to deposit both the barrier liner 14 and the copper seed layer 16 together. Depositing both the barrier layer 14 and the seed layer 16 is helpful to reduce the possibility of delamination between these layers.

FIG. 1B illustrates a cross section of the structure of FIG. 1A after the deposition of the interconnect material 20. Prior to the deposition of the interconnect material 20, photoresist masking structures 18 are formed via standard lithography processes. The thickness of the photoresist can range from one micron to sixty microns or more depending on the interconnect thickness called out by the application.

After the photoresist mask 18 is formed, the interconnect material 20, copper in this example, is deposited. In the embodiment of FIG. 1B, the interconnect material 20 is deposited with an electroplating process, but other techniques can be used.

FIG. 1C illustrates the structure of FIG. 1B after further processing. In FIG. 1C, the photoresist mask 18 has been removed with a solvent strip treatment, which is used to preserve the integrity of the copper interconnect line. The interconnect structure 24 shows a seamless bond between what was the seed layer 16 and the interconnect material 20.

FIG. 1D illustrates a cross section of the intended interconnect 24 achieved with a localized thick interconnect process after additional etch steps. An etch step has removed the copper seed layer 16 as well as a little bit of the copper on the thick interconnect line 24. Another etch step has removed the exposed barrier liner 14 by using the copper interconnect line 24 as hard mask. The barrier etch chemistry is particularly selective so as to prevent removal of any further copper from the interconnect line 24. The remaining barrier material 22 is underlying the thick interconnect line 24.

The copper interconnect line 24 width results from the width of the photoresist mask 18 opening minus the copper material lost during the copper seed layer etch step. Similarly, the copper interconnect line 24 height results from the depth of the photoresist mask 18 opening, the amount of copper material 20 deposited in the photoresist mask 18 opening, and the amount of copper material sacrificed during the copper seed layer 16 etch step. In the embodiment of FIG. 1D, the final interconnect structure 24 is 5 to 15 microns high and at least 5 microns wide. In other embodiments, the final interconnect structure 24 can be 50 microns or more high and 50 microns or more wide or any other suitable dimensions.

In FIG. 1D, the structure shows a single interconnect line 24. Many interconnect lines can be formed at the same time. During the seed layer and copper deposition processes, the partially formed interconnects will be electrically shorted together. Following the steps described herein, however, with respect to FIG. 1D, the formed interconnect lines will be electrically isolated from each other where desired.

FIG. 1E illustrates another step in the formation of the interconnect. An anti-diffusion layer 26 is added over the interconnect line 24. The anti-diffusion layer 26 completely encapsulates the copper lines 24 and prevents the diffusion of copper atoms to the underlying and surrounding structures. Some typical diffusion barrier 14 materials include pure or alloyed cobalt (Co), tantalum (Ta), tantalum nitride (TaN), titanium nitride (TiN), titanium tungsten (TiW) or silicon nitride ($Si_3N_4$). Other suitable materials may also be used.

BRIEF SUMMARY

According to one embodiment, an electronic device is formed on a semiconductor substrate. The electronic device includes a thick copper interconnect having a first width and a first height. The electronic device further includes a barrier liner positioned beneath the thick copper interconnect. The barrier liner has a second width and a second height wherein the second width of the barrier liner is greater than the first width of the thick copper interconnect. The electronic device also includes a dielectric layer positioned beneath the barrier liner and above the semiconductor substrate.

According to one embodiment, sidewall spacers are formed on the copper interconnect layer. The sidewall spacers are formed prior to etching the barrier layer. The sidewall spacers have a known width to provide a set spacing for the barrier layer relative to the copper interconnect layer. After the sidewall spacers are formed, the barrier layer is etched using the sidewall spacers as an etch mask. The barrier layer is therefore self-aligned with respect to the copper layer and has a known additional width beyond the width of the copper layer.

According to yet another embodiment, a dielectric layer is formed overlying a semiconductor substrate. The substrate has transistors and appropriate contacts previously formed therein in a manner well known in the art. The dielectric layer electrically insulates the semiconductor substrate and the transistors formed therein from overlying conductive interconnect layers. Preferably, a copper layer is used for the interconnect since it provides a low resistance and high current carrying capability. In order to isolate the copper from other structures, a barrier layer is deposited over the dielectric layer. A copper layer is then deposited over the barrier layer and the copper layer is patterned and etched using a first mask. The barrier layer is then etched. When the barrier layer is etched, it will have a second width, the second width being much wider than the first width of the copper layer.

According to another embodiment, the copper interconnect lines have a desired first width according to a desired design rule. A second mask is then used to define the barrier layer. The second mask retains a large width for the barrier layer on either side of the copper layer. The mask openings for the second layer are sized and aligned to leave a large barrier layer on either side of the copper interconnect layers so that the copper has a width that is recessed relative to the barrier layer. When the barrier layer is etched, it will have a second width, the second width being much wider than the first width of the copper layer.

BRIEF DESCRIPTION OF THE SEVERAL VIEWS OF THE DRAWINGS

FIG. 1C illustrates the structure of FIG. 1B after photoresist removal.

FIG. 2 illustrates an embodiment having a problem that may occur with the known techniques of forming localized interconnects.

FIG. 4C illustrates one step in the formation of a structure according the present invention.

DETAILED DESCRIPTION

Figure 3:
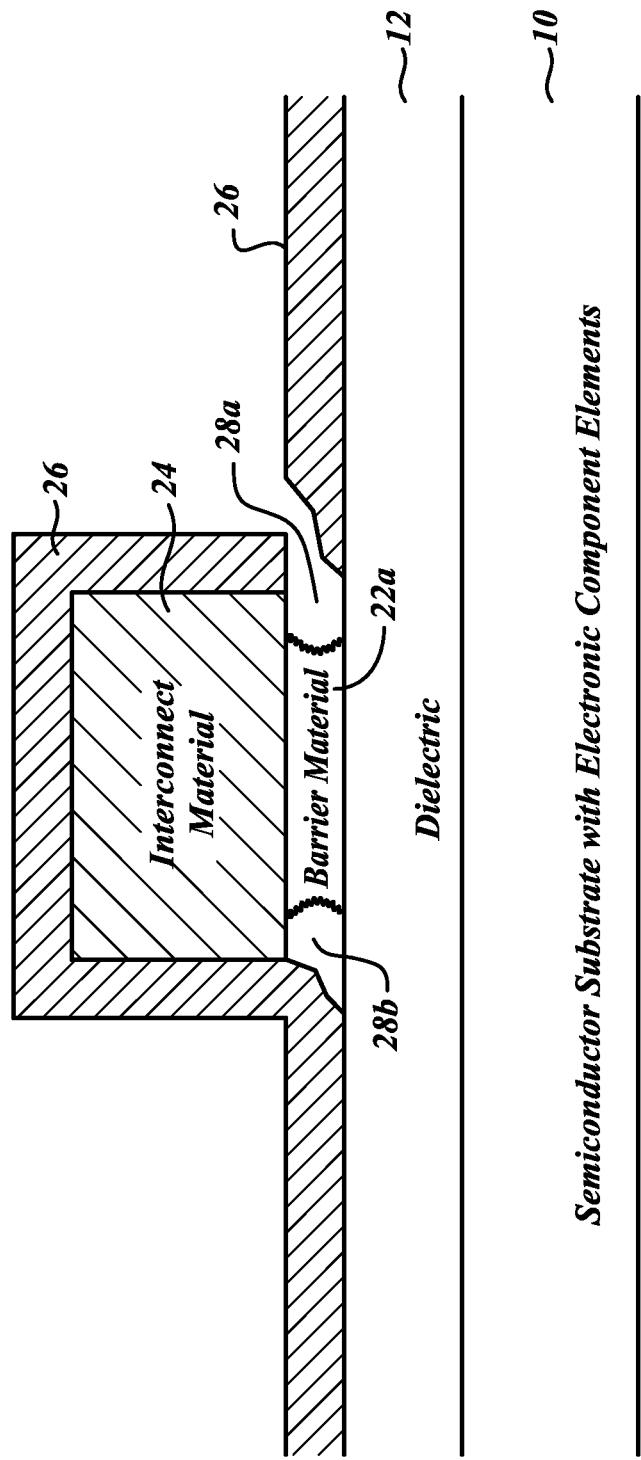
FIG. 3 illustrates an imperfect anti-diffusion layer formed over an interconnect.

FIGS. 2 and 3 illustrate a problem the inventor has realized may occur with the known techniques of forming localized thick interconnects. In the embodiment of FIG. 2, a thick copper interconnect is constructed as described for FIGS. 1A-1E. Accordingly, FIG. 2 illustrates a dielectric layer 12 which overlies the semiconductor substrate 10 and the various transistors and other electronic and mechanical components formed thereon at the stage of FIG. 1D. In FIG. 2, the anti-diffusion layer 26 of FIG. 1E has not yet been formed.

Figure 1A:
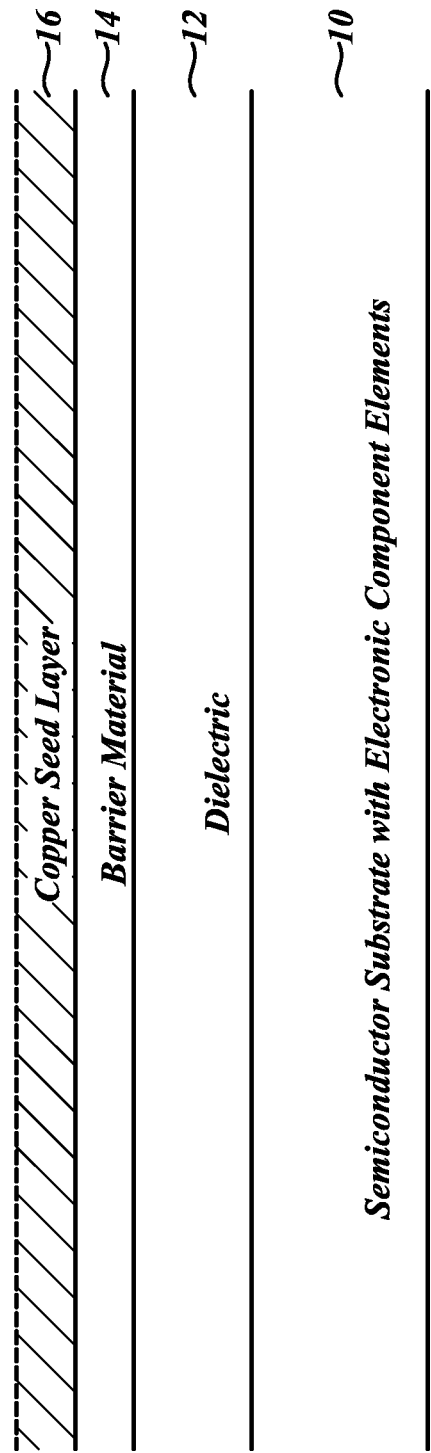
FIG. 1A illustrates a semiconductor substrate wafer having various electronic components and foundational interconnect layers formed thereon.
Figure 1B:
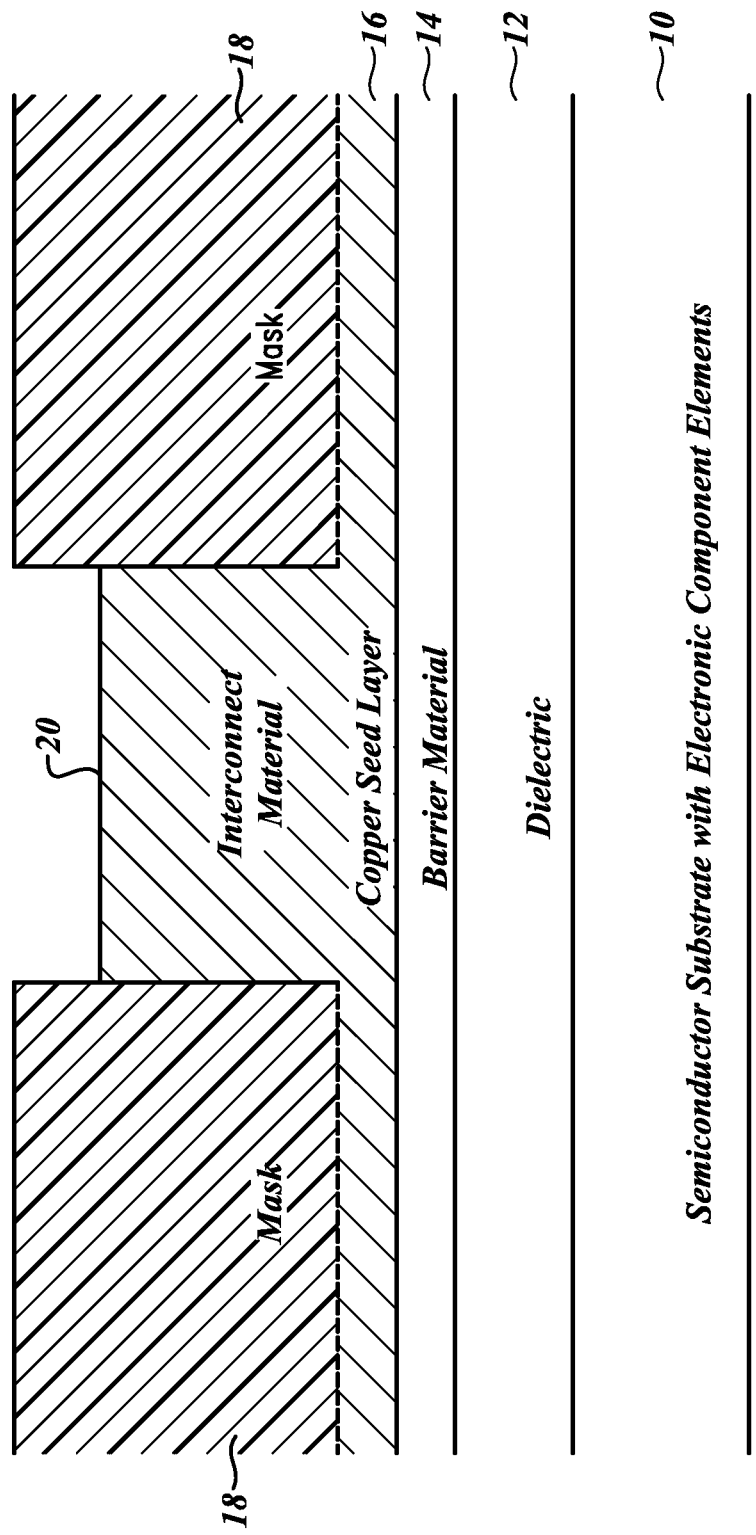
FIG. 1B illustrates a cross section of the substrate following copper electroplating deposition.
Figure 1D:
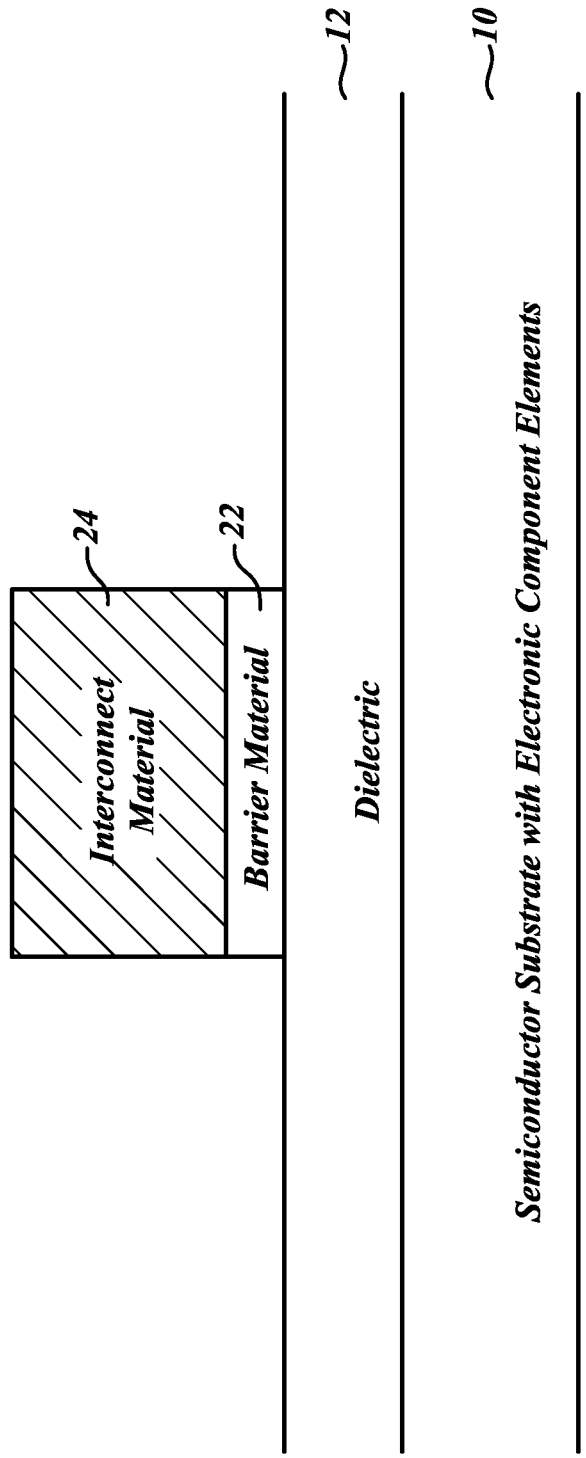
FIG. 1D illustrates a cross section of the intended interconnect achieved with a localized thick interconnect process.
Figure 1E:
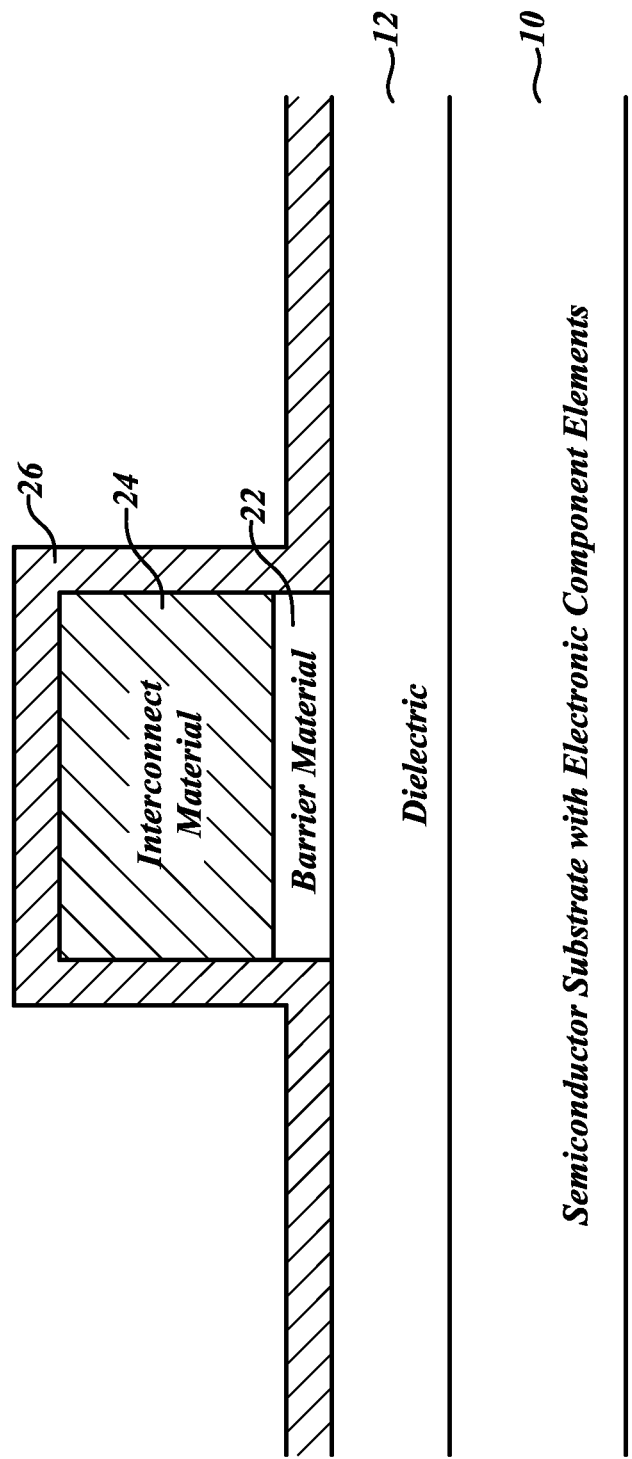
FIG. 1E illustrates another step in the formation of the interconnect.

FIG. 2 illustrates how the conventional etching techniques failed to form the desired shape or boundaries of the final barrier liner 22 (FIG. 1D). The copper interconnect line 24 was used as a hard mask, but the barrier etch chemistry was not as selective as desired. Instead, the conventional etch techniques formed barrier liner 22a.

FIG. 2 illustrates a situation where the barrier liner 22a undercuts beneath the copper interconnect 24. In this situation the compromised barrier liner 22a has at least two disadvantages.

A first disadvantage of the compromised barrier liner 22a is the creation of higher mechanical stress between the barrier liner 22a and the copper interconnect 24. In addition to weakening the interconnect line 24, this problem may also impact the integrity of the underlying dielectric layer 12 or circuitry of the semiconductor wafer 10.

A second disadvantage of the compromised barrier liner 22a is illustrated in FIG. 3. FIG. 3 illustrates an imperfect anti-diffusion layer 26 formed over the interconnect 24. The anti-diffusion layer 26 of FIG. 3, however, is imperfect because it has a first area of poor step coverage 28a and a second area, void 28b, where the anti-diffusion layer 26 does not fill. In addition to weakening the structures, the poor step coverage area 28a and the void 28b caused by the malformed barrier liner 22a also create potential copper migration paths.

The anti-diffusion layer 26 is often a silicon-nitrogen compound such as SiN, however other elements and compositions may be used. For example, in some cases, polymer based anti-diffusion layers may be used. A PECVD process conventionally forms anti-diffusion layer 26, and in areas where surfaces are fully exposed to the PECVD gasses, uniform coverage of the anti-diffusion layer 26 results. On the other hand, such as illustrated in FIG. 3, an undercut barrier liner 22a causes problems for the deposition of the anti-diffusion material. Part of the undercut can prevent full exposure to the PECVD gasses, which in turn can result in an area of poor step coverage 28a of the anti-diffusion layer 26.

The problem evidenced as poor step coverage 28a is not fixed by lengthening or intensifying the PECVD anti-diffusion layer 26 formation process. That is, even if sufficient anti-diffusion layer 26 material is allowed to form on the exposed surfaces of the interconnect 24 and dielectric layer 12, the anti-diffusion layer 26 will tend to create voids such as shown by void 28b.

Both poor step coverage area 28a and void area 28b provide potential paths of copper atom migration. In both cases, area 28a and void 28b, copper atoms may migrate down through the dielectric layer 12 and into the semiconductor substrate 10. The migration of copper atoms may spoil the underlying electronic and/or electromechanical structures formed on the substrate 10.

A failure to isolate the copper interconnect from the underlying structures may permit copper atoms to migrate into the monocrystalline silicon structure and cause operational defects. Copper atom migration is often induced by electrical fields and assisted by elevated temperatures, both of which occur while the chip is operating. The failure from this type of process may therefore occur after the chip is operating and not be detected in tests when the chip is made.

In addition to permitting diffusion of copper atoms into the substrate 10, the opening in the anti-diffusion layer 26 formed at area 28a may cause further problems. For example, copper atoms may diffuse from the interconnect material 24 through opening 28a and through a similar opening in another nearby interconnect. In such a case, the copper atom migration path may form a short circuit between one interconnect 24 and the other interconnect structures.

Figure 4A:
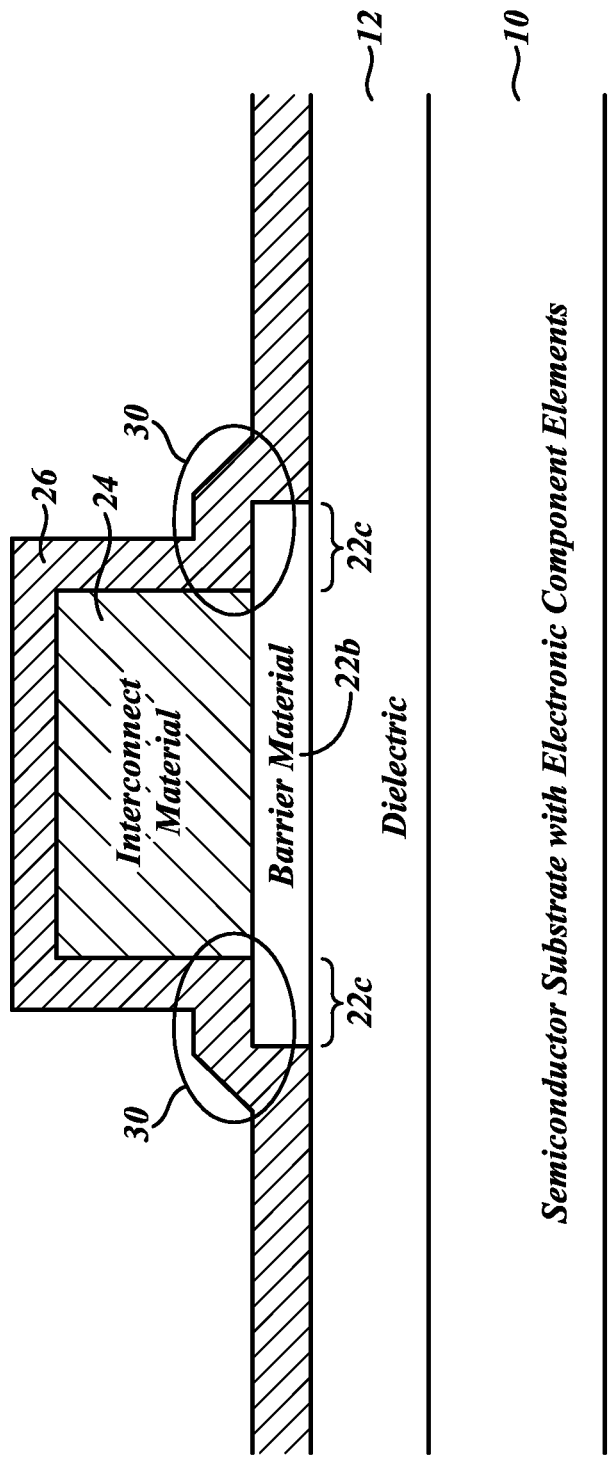
FIG. 4A illustrates a semiconductor interconnect structure that provides an electrically, mechanically, and cost efficiently robust interconnect line according to the present invention.

To address the disadvantages caused by the localized thick process for forming conductive interconnects, new techniques and structures are now discussed. FIG. 4A illustrates a semiconductor interconnect structure that provides an electrically, mechanically, and cost efficiently robust interconnect line according to one embodiment.

The structure of FIG. 4A has as the inventive barrier liner 22b having an extended width at regions 30 on both sides of the interconnect line 24. This additional width 22c is made larger than the known tolerance of the masks by a selected amount. Thus, even if the mask performing the barrier liner 22b is misaligned by the maximum allowed amount within its tolerance range, the region 30 will still be formed having some width extending on either side of the interconnect 24 so as to form a final barrier layer 22b between the interconnect 24 and the dielectric 12 having a region 22c extending beyond the copper interconnect 24. The barrier liner 22b is thus much wider than the interconnect 24 on all adjacent sides.

Having the wider liner 22b of FIG. 4A addresses the disadvantages of the conventional localized thick interconnect processes. Barrier liner 22b provides reduced mechanical stress of the interconnect 24 over a liner which is exactly the same width as interconnect 24. Further, barrier liner 22b provides surface areas fully exposed to the deposition processes of anti-diffusion layer 26. Due to the extended width of barrier liner 22b, undercut regions, such as region 28 of FIG. 3, do not have an opportunity to form.

Figure 4B:
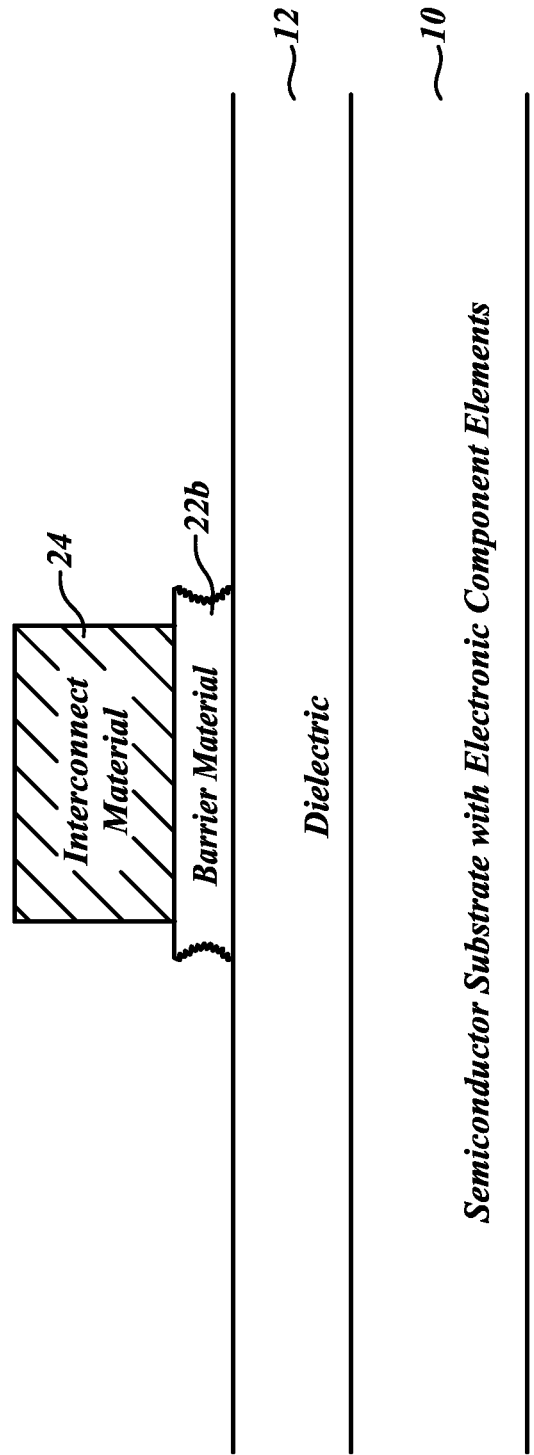
FIG. 4B illustrates a cross section of desirable interconnect line according the present invention.

FIG. 4B shows another embodiment that achieves the design of FIG. 4A according to a method of the present invention. In the embodiment of FIG. 4B, the prior art techniques are practiced up until the step of FIG. 1D, as shown. After the step of FIG. 1D, a second etch process, also known as a touch-up etch, is carried out. The touch-up etch is highly selective to etch only the interconnect material 24. In the case where copper is used for the interconnect material, a copper etch is used, preferably an isotropic etch, which etches copper equally on all sides. The isotropic etch of the interconnect 24, which removes material on the exposed top and sidewalls, causes the interconnect 24 to be shorter and thinner than it was prior to the etch. This causes the barrier material 22b to now be wider than the interconnect layer 24 and, thus, avoid the problems of the prior art.

The amount of etching carried out of the interconnect metal 24 in the second etch may be based upon the expected undercut that occurred when the barrier material 22 was etched in a previous step such as is shown from FIG. 1C to FIG. 1D. As has been previously described, when the layer 22 is etched, some portion of the layer 22 may be undercut under the interconnect layer due to an undercut during the etching or due to overetching. This undercut or overetching may cause the problems illustrated in FIG. 3.

In FIG. 4B, the interconnect material 24 is etched by an amount that somewhat exceeds the expected amount of the underetch of the material 22. For example, if the underetch is in the range 100 nm, an isotropic etch that etches the interconnect 24 by approximately 300-500 nm will be acceptable. This will be sufficient to ensure that the barrier material 22b extends some distance beyond the edges of the metal interconnect 24.

The initial size of metal interconnect 24 can be made larger than the final design size by an amount equal to the expected later etching step. Accordingly, after the final etching has taken place, the interconnect layer 24 will have the desired line width, which will be a width less than that of the barrier material 22b over which the interconnect 24 is formed. The various layers in FIG. 4B are not shown exactly to scale, but rather the features of interest are somewhat enlarged.

In summary, according to an alternative embodiment, the copper etching is carried out at two different times. First, a copper etch is performed to remove the seed layer 16, which also removes a small portion of the interconnect layer 24.

Subsequently, the barrier layer 14 is etched to form a barrier material layer 22 underneath the interconnect layer 24. This etch is carried out using the interconnect layer 24 as the mask so the barrier material 22 is self-aligned with respect to the interconnect material 24. Subsequently, the copper is etched a second time to have a dimension somewhat smaller than the barrier material 22b on which it sits. This is also a self-aligned etch, done without a mask, so the edges of the material 24 will have a dimension and location with respect to the edge of layer 22 as determined by an etch rather than a separate masking step.

FIG. 4C illustrates another technique to achieve the extended barrier material layer 22b as shown in FIG. 4A. According to this embodiment, the copper layer is formed according to the techniques of the prior art as shown through FIG. 1C. The seed layer 16 and interconnect material 24 are not necessarily drawn to scale in FIG. 1C, since in most instances, the seed layer 16 will be significantly thinner than shown with respect to interconnect layer 24. Nevertheless, the dimensions of layers in FIG. 1C is simplified to more easily illustrate the steps of forming the extended width barrier layer 22b.

After the structure as shown in FIG. 1C is formed, different steps are carried out according to principles of the present invention. The copper layer 24, including the copper layer 16, is subjected to a highly selective copper etch which does not etch the barrier material 14. The highly selective copper etch removes the seed layer 16 and a small amount of the interconnect material 24. After the copper seed layer 16 has been removed, a photoresist or other mask 25 is formed over the interconnect 24 and a selected portion of barrier layer 14. The mask 25 has a width that is distance d wider than the interconnect layer 24.

The distance d is selected to form the barrier material 22b such that barrier material 22b extends for a wide distance on either side of the interconnect material 24. According to one embodiment, the distance d is selected to be equal to the minimum line width available on the semiconductor process, plus an additional width equal to the tolerance of error in the misalignment of the photoresist or mask. Accordingly, when the mask 25 is formed, there is assurance that there will be an overlapping portion 22c at least equal to the minimum line width available in that particular process on either side of the interconnect metal 24. In one alternative embodiment, the width of the entire mask 25 is equal to the width of the interconnect material 24 plus the minimum line width d. In this embodiment, the spacing on either side of the interconnect material 24 will be one-half d or d/2. Of course other processing techniques may also be used.

The extended liner 22b may extend beyond the boundary of the interconnect line 24 by any desirable amount. For example, in some cases, the extended liner 22b extends beyond the interconnect line 24 by 0.25 to 0.3 microns on each side. In some cases, the extended liner 22b is 2% to 30% wider than the interconnect line 24. In other cases, the final dimensions of the barrier layer 22b are different.

In another alternative embodiment, the seed layer 16 is not present. In this alternative embodiment, the sequence of steps includes a blanket deposition of a conductive layer and then a mask and etch of the blanket deposit conductive layer to form interconnect layer 24. Next, after interconnect layer 24 is formed, the barrier layer 22 is etched to be self-aligned with the interconnect layer 24. The barrier layer may be etched using the same mask that was used to create the interconnect layer 24. After etching the barrier layer 22, a second self-aligned etch is performed, this time with the interconnect material 24.

In the second self-aligned etch, the barrier layer is not etched. Instead, the interconnect layer 24 is etched in order to slightly reduce the width of the interconnect layer 24. The amount of material removed by the second self-aligned etch is selected to be an amount slightly more than the amount of undercut which may have occurred during the previous etching of the barrier material 22. This achieves the barrier material 22b having a width greater than the width of the interconnect layer 24. This self-aligned technique is beneficial in assuring that the barrier material 22 will always be wider than the interconnect material 24 without the use of a mask.

The extended liner 22b of FIGS. 4A-4C addresses disadvantages of the localized thick process described previously. Accordingly, any additional steps taken to extend the liner 22b provide an overall cost efficiency by increasing the yield of functional parts. In particular, the extended liner 22b allows for better conformal deposition of the anti-diffusion layer 26. Thus, extended liner 22b provides a desirable encapsulation of the copper thick interconnect line 24, which closes any potential copper migration paths that could emanate from the interconnect line 24. Further, the extended liner 22b reduces the mechanical stress at the copper interconnect 24 edge between the copper interconnect line 24 and the barrier liner 22b. Thus extended liner 22b preserves the integrity of the dielectric and other layers below.

Figure 5A:
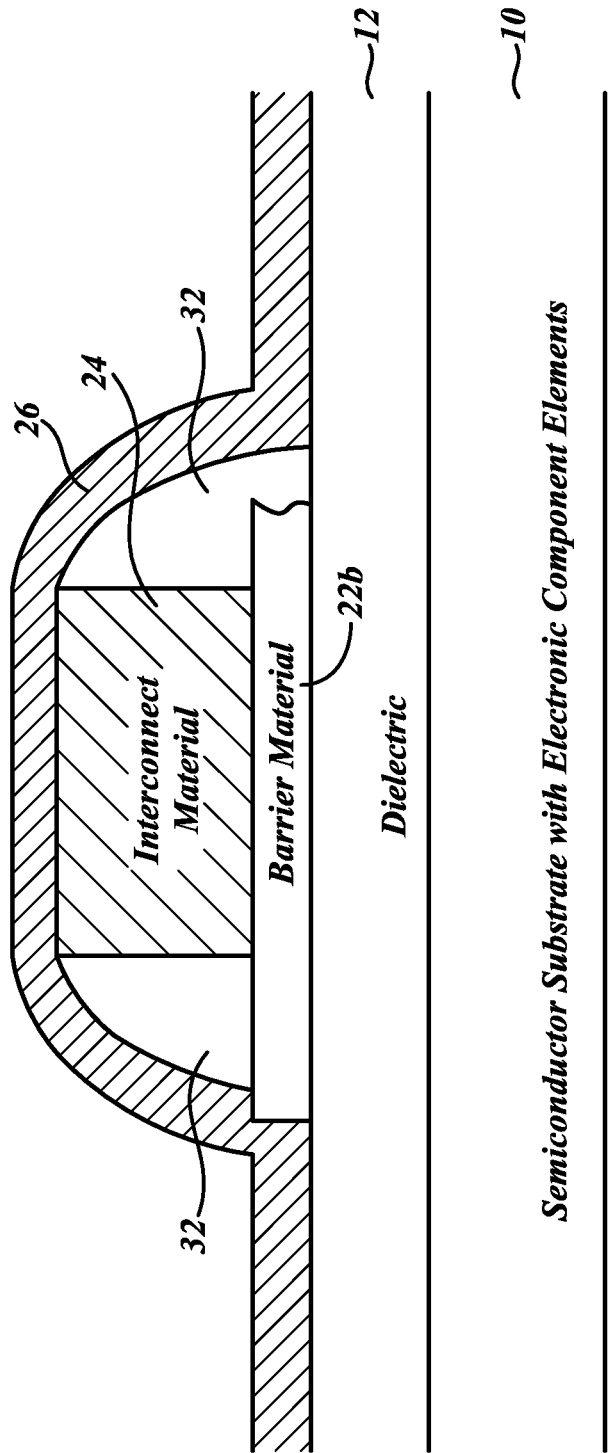
FIG. 5A illustrates another embodiment according to the present invention.

FIG. 5A illustrates another embodiment according to the present invention. A copper interconnect layer 24 is formed using the same techniques used for forming the copper interconnect layer 24 of FIGS. 4A-4C as previously described.

Referring, for example, to FIG. 4A, and prior to the formation of the anti-diffusion layer 26, another dielectric layer (not shown) is deposited over the entire substrate. When deposed, this new dielectric layer has a substantial vertical height that rises above and covers interconnect 24. The dielectric spacer layer is thereafter anisotropically etched without a separate lithographic step to form sidewall spacers 32 on both sides and adjacent to the copper interconnect layer 24. The sidewalls 32 are shown in FIG. 5A. Providing the sidewall spacers permits a uniform coverage of the deposed anti-diffusion layer 26.

An additional feature of the embodiment of FIG. 5A addresses cases in which the barrier liner 22b is formed with imperfect alignment below interconnect 24. That is, the interconnect 24 is located closer to one edge of the barrier liner 22b than an opposite edge. Nevertheless, the designed tolerances of the etching processes are such that barrier liner 22b has a width that extends at least a minimum distance from each side of interconnect 24. Subsequently, spacers 32 are formed such that any overhangs are covered and a smooth, predominantly solid surface is presented for deposition of the anti-diffusion layer 26. The encapsulation of the interconnect 24 that is made possible by the combination of sidewall spacers 32 and the extended barrier liner 22b prevents migration of the copper atoms to structures formed in the substrate 10 or nearby structures formed above substrate 10.

Figure 5B:
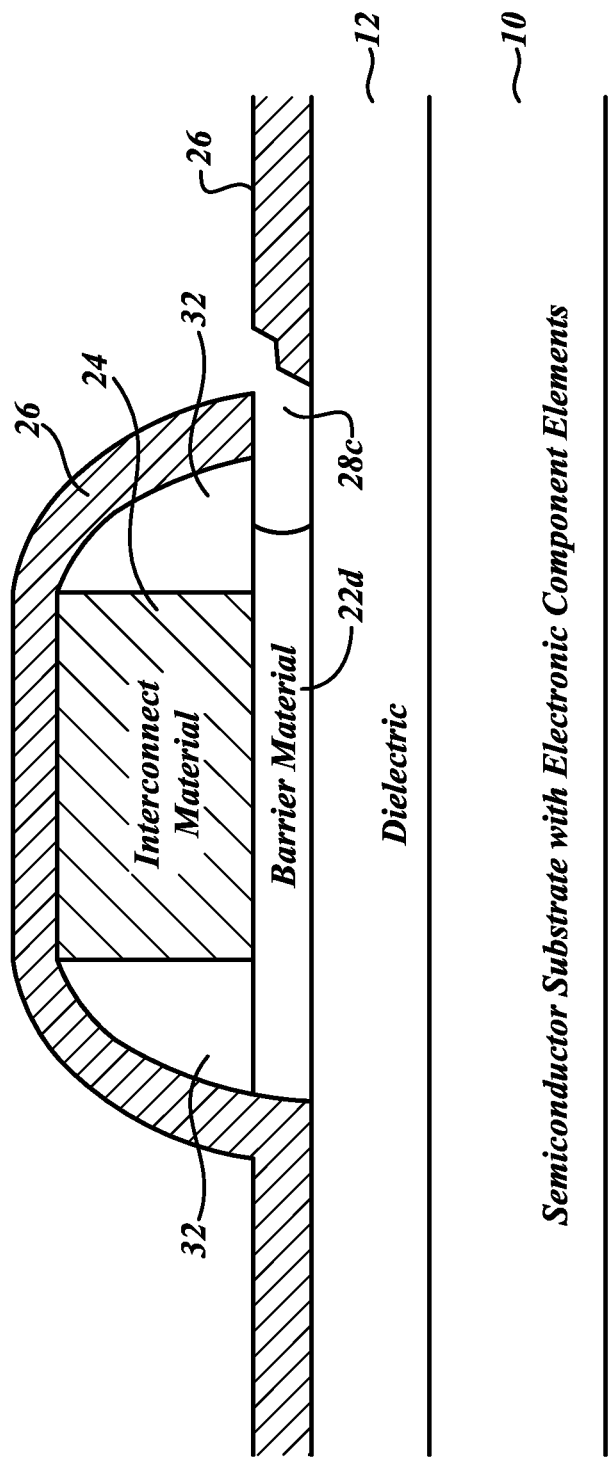
FIG. 5B illustrates yet another embodiment according to the present invention.

FIG. 5B illustrates yet another embodiment according to the present invention. According to the embodiment of FIG. 5B, a blanket dielectric layer is deposited over the structure at the stage shown in the prior art of FIG. 1C or just after the seed layer 16 has been etched, as previously described with respect to the present invention. After the conforming dielectric layer has been deposited, an isotropic etch is carried out which leaves sidewalls 32 adjacent the sidewalls at the interconnect metal 24. The sidewalls 32 cover a portion of the barrier layer 22 adjacent either sides of the interconnect 24.

After the sidewalls 32 are formed, an etch of the barrier layer 14 is carried out, leaving a barrier material 22d underneath the interconnect material 24. Desirably, the barrier material 22*d* will have an additional width on either side of the interconnect material 24 that is equal to the width of the sidewall spacers. In a preferred etch condition, the barrier material 22*d* will be aligned at the edges with the sidewall spacer 32, as shown on the left side of FIG. 5B.

In the event of some overetching of the barrier layer 14 during the formation of the barrier material 22*d*, there may be some undercutting of the barrier material 22*d* below the sidewall spacer 32. An example of such an undercutting is shown on the right side of FIG. 5B. When the antidiffusion layer 26 is later formed, it might, if the undercut edge is great, have a small break in the step coverage at 28*c* as shown. However, even if there is a break in the step coverage at 28*c*, the interconnect layer 24 is still completely encased by the antidiffusion barrier 26, the sidewall 32, and the barrier material 22*d* so that the interconnect layer 24 is completely surrounded and cannot contaminate the silicon substrate 10.

The solutions presented herein improve the reliability of conductive interconnects. For example, a problem of poor step coverage of an anti-diffusion layer is addressed. In addition, a problem of mechanical stress at the interconnect edges is addressed. The solutions presented herein generate structures that provide improved conductive interconnect encapsulation and improved mechanical strength.

In the embodiments described herein, electronic and/or electromechanical elements are formed on a semiconductor substrate, e.g., semiconductor components, active components, passive components, bond pads, vias, and the like. Generally, the semiconductor substrate is comprised of monocrystalline silicon, but any other suitable substrate may be used.

Additionally, in the embodiments described herein, the thick conductive interconnect is formed of copper or a copper alloy such as copper cobalt (CuCo), copper titanium (CuTi), and others. Generally, however, the inventive principles described herein apply to any suitable conductive material used for the interconnect. For example, other materials that can be used to form interconnects include, but are not limited to, aluminum, titanium, indium, cobalt, tantalum, ruthenium, and any other suitable conductive element, including alloys thereof.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor structure, comprising:
a semiconductor substrate;
a dielectric layer overlying the semiconductor substrate;
a barrier layer overlying the dielectric layer, the barrier layer having a first width; and
an electrically conductive interconnect positioned over and in contact with the barrier layer, the electrically conductive interconnect having a second width that is substantially less than the first width and a height of 5 to 50 microns, wherein the difference in widths between the barrier layer and the electrically conductive interconnect is sufficient to prevent the barrier layer from undercutting the electrically conductive interconnect during formation of the semiconductor structure.

2. The semiconductor structure according to claim 1 wherein the second width is at least 0.3 microns less than the first width.

3. The semiconductor structure according to claim 1 wherein the first width is at least five percent larger than the second width.

4. The semiconductor structure according to claim 1 wherein the electrically conductive interconnect is about 5 to 15 microns high and at least 5 microns wide.

5. The semiconductor structure according to claim 1, further including sidewall spacers positioned adjacent to the electrically conductive interconnect wherein the barrier layer is self-aligned with the sidewall spacers.

6. The semiconductor structure according to claim 1 wherein the conductive interconnect consists of copper or a copper alloy.

7. The semiconductor structure according to claim 1 wherein the barrier layer is an electrically conductive material.

8. The semiconductor structure according to claim 1, further comprising:
an anti-diffusion layer formed over the electrically conductive interconnect.

9. The semiconductor structure according to claim 8 wherein the anti-diffusion layer is in direct contact with portions of the electrically conductive interconnect, the barrier layer, and the dielectric layer.

10. An electronic device formed on a semiconductor substrate, comprising:
a copper interconnect, the copper interconnect having a first width and a first height, the first height being at least 2 microns;
a barrier liner positioned beneath the copper interconnect, the barrier liner having a second width and a second height, the second width being greater than the first width; and
a dielectric layer positioned beneath the barrier liner and above the semiconductor substrate.

11. The electronic device according to claim 10 wherein the first width is less than or equal to 95 percent of the second width.

12. The electronic device according to claim 10 wherein the first width is at least 5 microns, the second width is at least 5.3 microns, the first height is about 5 to 15 microns, and the second height is about 0.2 to 0.5 microns.

13. The electronic device according to claim 10 wherein the first height is greater than 25 microns.

14. The electronic device according to claim 10, further comprising:
an anti-diffusion layer formed over the copper interconnect.

15. The electronic device according to claim 10 wherein the copper interconnect is a copper alloy.

16. A semiconductor structure, comprising:
a semiconductor substrate;
a dielectric layer overlying the semiconductor substrate;

a barrier layer overlying the dielectric layer, the barrier layer having a first width, the first width being uniform throughout the barrier layer; and a copper interconnect formed over and in contact with the barrier layer, the copper interconnect having a second width that is narrower than the first width and a height of at least 5 microns.

17. The semiconductor structure according to claim 16 wherein the copper interconnect has a height of 7 to 10 microns.

18. The semiconductor structure according to claim 16 wherein the copper interconnect is formed from a copper titanium or copper cobalt alloy.

19. The semiconductor structure according to claim 16 wherein the barrier layer is formed from at least one of cobalt, tantalum, tantalum nitride, titanium nitride, titanium tungsten, or silicon nitride.

20. The semiconductor structure according to claim 16 wherein the copper interconnect has a height of 5 to 50 microns and wherein the barrier layer is configured to resist a migration of copper atoms from the copper interconnect.

21. The semiconductor structure according to claim 16 wherein the barrier layer is configured reduce mechanical stress on the interconnect.

* * * * *